United States Patent [19]
Tanimoto

[11] Patent Number: 5,831,716
[45] Date of Patent: Nov. 3, 1998

[54] SLIT-SCANNING TYPE LIGHT EXPOSURE APPARATUS

[75] Inventor: Akikazu Tanimoto, Yokohama, Japan

[73] Assignee: Nikon Corporation, Japan

[21] Appl. No.: 834,851

[22] Filed: Apr. 10, 1997

Related U.S. Application Data

[62] Division of Ser. No. 409,935, Mar. 23, 1995, Pat. No. 5,663,784, which is a continuation of Ser. No. 256,000, Jun. 8, 1994, abandoned.

[30] Foreign Application Priority Data

Jun. 10, 1993 [JP] Japan ................................ 5-138489

[51] Int. Cl.⁶ ............................ G03B 27/74; G03B 27/72
[52] U.S. Cl. ................................................ 355/68; 355/69
[58] Field of Search ................................ 355/43–45, 53, 355/67, 68, 69, 71, 77; 250/492.1, 492.2, 492.3, 398, 548

[56] References Cited

U.S. PATENT DOCUMENTS

| | | | |
|---|---|---|---|
| 4,682,885 | 7/1987 | Torigoe | 355/67 |
| 4,711,568 | 12/1987 | Torigoe et al. | 355/68 |
| 4,819,033 | 4/1989 | Yoshitake et al. | 355/53 |
| 4,822,975 | 4/1989 | Torigoe | 219/121.85 |
| 4,884,101 | 11/1989 | Tanimoto | 355/68 |
| 4,901,109 | 2/1990 | Mitome et al. | 355/68 |
| 4,905,041 | 2/1990 | Aketagawa | 355/53 |
| 4,924,257 | 5/1990 | Jain | 355/53 |
| 4,970,546 | 11/1990 | Suzuki et al. | 355/53 |
| 5,053,614 | 10/1991 | Yui et al. | 250/205 |
| 5,097,291 | 3/1992 | Suzuki | 355/53 |
| 5,107,275 | 4/1992 | Tsuruoka et al. | 346/1.1 |
| 5,119,390 | 6/1992 | Ohmori | 372/25 |
| 5,121,160 | 6/1992 | Sano et al. | 355/53 |
| 5,148,214 | 9/1992 | Miura et al. | 355/53 |
| 5,160,962 | 11/1992 | Nishi | 355/53 |
| 5,194,893 | 3/1993 | Nishi | 355/53 |
| 5,227,839 | 7/1993 | Allen | 355/53 |
| 5,250,797 | 10/1993 | Sano et al. | 355/68 |
| 5,255,051 | 10/1993 | Allen | 355/77 |
| 5,281,996 | 1/1994 | Bruning et al. | 355/77 |
| 5,285,236 | 2/1994 | Jain | 355/53 |
| 5,291,240 | 3/1994 | Jain | 355/53 |
| 5,329,336 | 7/1994 | Hirano | 355/53 |
| 5,363,172 | 11/1994 | Tokuda | 355/71 |
| 5,473,410 | 12/1995 | Nishi | 355/53 |
| 5,477,304 | 12/1995 | Nishi | 355/53 |
| 5,567,928 | 10/1996 | Sano | 250/205 |
| 5,581,075 | 12/1996 | Naruki et al. | 355/69 |
| 5,663,784 | 9/1997 | Tanimoto | 355/68 |

FOREIGN PATENT DOCUMENTS

| | | |
|---|---|---|
| 63-288014 | 11/1988 | Japan . |
| 2-177314 | 7/1990 | Japan . |

*Primary Examiner*—D. Rutledge
*Attorney, Agent, or Firm*—Shapiro and Shapiro

[57] ABSTRACT

A light exposure apparatus used for manufacturing semiconductors, liquid crystal display elements or the like is provided with an illuminating optical system for illuminating a mask formed with a pattern with pulse light from a light source, a mask stage for loading the mask, a substrate stage for loading the photo-sensitive substrate, and a driving system for synchronously scanning the mask stage and a substrate stage. The light exposure apparatus further includes a stop having two edges for limiting the shape of an illuminating area on the mask to a predetermined shape due to an illuminating optical system, an edge position adjusting portion for adjusting a position of one or both edges with respect to a scanning direction, an exposure light energy detecting unit for detecting energy per pulse, a calculating portion for calculating, based on information from the exposure light energy detecting unit, accumulating amounts of exposure light per each of accumulated exposure light amount calculating zones obtained by dividing the illuminating area at predetermined intervals in the scanning direction of the photo-sensitive substrate, and a control portion for controlling the edge position adjusting portion in response to a difference between a predetermined accumulated amount of exposure light and a calculated amount of exposure light.

25 Claims, 5 Drawing Sheets

SLIT-SCANNING TYPE LIGHT EXPOSURE APPARATUS

This is a division of application Ser. No. 08/409,935, filed Mar. 23, 1995, now U.S. Pat. No. 5,663,784, which is a continuation of application Ser. No. 08/256,000 filed Jun. 8, 1994 (abandoned).

BACKGROUND OF THE INVENTION

1. Field of the Invention

The present invention relates to a light exposure apparatus such as a light exposure apparatus used for manufacturing semiconductors, liquid crystal display elements or the like by means of a photolithographic process, and more particularly to a so-called slit-scanning type light exposure apparatus for successively exposing the pattern of a mask on light-sensitive substrates by scanning the mask and the photosensitive substrates in synchronism in a slit-like illuminating area.

2. Related Background Art

Upon manufacturing semiconductors or liquid crystal display elements by means of a photolithographic process, a projection light exposure apparatus is used which exposes the pattern of photomask or a reticle (hereinafter generally referred to as the "reticle") on substrates (wafers, glass plates or the like) coated with photosensitive material through a projecting optical system. Conventionally, a stepper is mainly used as a projection light exposure apparatus to manufacture semiconductors. The stepper is a projection light exposure apparatus which successively totally transcribes the pattern image of a reticle pattern images in shot areas in a step and repeat way.

However, a so-called slit-scanning type projection light exposure apparatus has come to be developed, which will be described briefly.

In the slit scanning type projection light exposure apparatus, a reticle is scanned at a speed V in a predetermined scanning direction in an illuminating area having an elongated rectangular shape, a circular shape or a hexagonal shape (hereinafter generally referred to as a "slit shape"), wafers are scanned at a speed $\beta \cdot V$ (where $\beta$ is the projection magnification of a projection optical system) in a direction conjugate with the scanning direction of the reticle in a light exposure area conjugate with the illuminating area and the projection optical system, and thus pattern images of the reticle is successively exposed and transcribed in exposure fields (shot areas) on the wafers.

The reasons why attention is paid to the slit scanning type light exposure apparatus are as follows:

First, as patterns of semiconductor devices have recently become finer and finer and the size of the devices have become larger and larger, much larger projection optical systems have been required. Thus, the manufacturing cost of the apparatus has become much higher and the size of the apparatus has also become much larger, reducing applicability of the apparatus to manufacture of semiconductors.

Secondly, as the device pattern has been finer and finer, distortions, flatness and astigmatism of the projection image of the projection optical system have come to be very nearly to their limitations, and thus high operational performance required for the stepper cannot be obtained.

With the slit scanning light exposure method, light exposure is performed by the use of only a slit-like light exposure area in the projection optical system of the projection optical system. When, therefore, the same projection optical system is used, the field size of the slit scanning type projection light exposure apparatus can be made larger by $2^{1/2}$ times than that of the stepper. In other words, with the same field size as the stepper, the slit scanning type projection light exposure apparatus can employ an optical system $\frac{1}{2}^{1/2}$ times smaller than the stepper, improving a lens characteristic more than the stepper.

Thirdly, in a case where a reflecting and refracting optical system having a concave reflecting mirror is used as a projection optical system, areas in the light exposure field in which good optical characteristics can be obtained are limited to narrow circular arc portions. Thus, a slit scanning light exposure system is required for exposing the whole pattern of the reticle on wafers.

In the general projection light exposure apparatus, a suitable amount of exposure light (exposure light energy) is selected depending on light sensitivity of photoresists coated on wafers. Under the condition where continuous light is used as exposure light in the stepper, the amount of exposure light is controlled in accordance with the illuminating time length of the exposure light. When pulse light is used, on the other hand, the amount of the exposure light is controlled by the number of pulses of the illuminating light.

SUMMARY OF THE INVENTION

The control of the amount of exposure light is also necessary in the slit scanning type projection light exposure apparatus. When, for example, continuous light is used as exposure light in this type of prior apparatus, the width of the slit-shaped illuminating area in its scanning direction is made constant, and the amount of exposure light on every wafer is controlled to a moderate value by adjusting the scanning speeds of the reticle and the wafers and the exposure light reduction rate.

When, however, a pulse light source is used for providing pulse light, e.g., an excimer laser or the like in a slit scanning type projection light exposure apparatus, energy variations of exposure light pulses are large. In consequence, it is difficult in the prior slit scanning type light exposure apparatus to set the accumulated values of the energies for respective pulses to a value within the allowed value.

It is accordingly an object of the present invention to obtain a required control accuracy for the amount of exposure light in spite of a small number of measurements of the generation of the pulse light when a pulse light source which produces light pulses having large energy variations is used.

In order to achieve this object of the present invention, a light exposure apparatus according to the present invention including an illuminating optical system for projecting light pulses from a light source on a mask formed with a pattern, a mask stage for carrying the mask, a substrate stage for carrying a photosensitive substrate and a driving system for scanning the mask stage and the substrate stage in synchronism with each other so that the pattern is exposed on the photosensitive substrate, comprises:

- a stop having two edges for limiting the shape of an illuminating area on the mask in the illuminating system to a predetermined shape;
- an edge adjusting portion for adjusting position or positions of one or both of the two edges with respect to a scanning direction of the mask;
- an exposure light energy detecting unit for detecting exposing energy per light pulse;
- a calculating portion for calculating, in response to information from the exposure light energy detecting portion, accumulated amount of exposure light per each of accumulated exposure light calculating zones formed by dividing the light exposure area on the photosensitive substrate at predetermined intervals in a scanning direction of the photosensitive substrate; and a control portion for controlling the edge adjusting portion in response to a difference between a predetermined accumulated amount of exposure light and an calculated amount of exposure light.

DESCRIPTION OF THE PREFERRED EMBODIMENTS

An embodiment of a projection exposure apparatus will be described with reference to the accompanying drawings. This embodiment relates to a slit scanning type light projection apparatus to which the present invention is applied.

Figure 1:
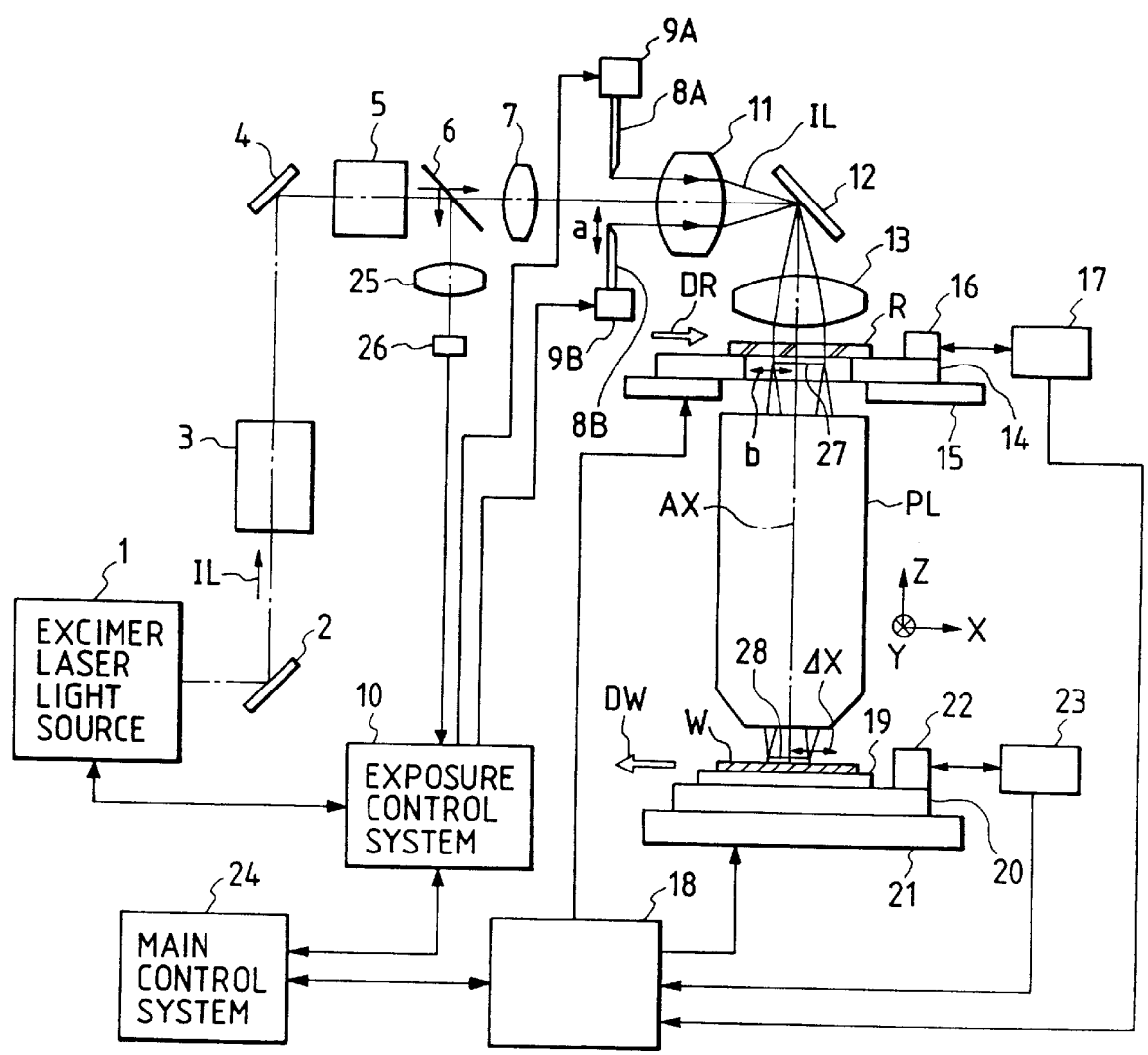
FIG. 1 is a general view showing a projection light exposure apparatus of an embodiment according to the present invention.

FIG. 1 shows a general structure of the projection exposure apparatus of this embodiment. An excimer laser light source 1 has a mechanism for generating KrF excimer laser beams (the wavelength: 248 nm) and narrowing the width of an oscillating spectrum to stabilize the oscillation spectrum so that its center is kept to a constant value. The excimer laser light source 1 produces pulse laser beams by the control signal of a light exposure control system 10 and sets the average value of output energies of pulses to a predetermined level. Pulse laser beams IL emitted from the excimer laser light source 1 are reflected by a mirror 2 and enter a beam reforming optical system 3 so as to be formed from an elongated rectangular shape into a nearly square shape in cross section.

The pulse laser beams IL emitted from the beam reforming optical system 3 are reflected by a mirror 4 and enter a beam uniforming optical system 5 which includes a fly-eye-lens and an oscillation mirror and has functions to make uniform intensity distributions of the incident laser beams and to cancel out unevenness of illuminance produced by interference fringes due to equalization. The pulse laser beams IL leaving the beam uniforming optical axis 5 enter a beam splitter 6 having a low reflectivity and then arrive at a pair of plate-like reticle blinds 8A and 8B at uniform intensity through a relay lens 7.

A pair of other plate-like reticle blinds which will be described later are arranged in parallel with the paper surface of FIG. 1. A slit-shaped elongated image between the two reticle blinds 8A and 8B passes through a relay lens 11, a mirror 12 and a main condenser lens 13 and is projected on a reticle R. A slit-shaped elongated illuminating area 27 defined by the reticle blinds 8A and 8B on the reticle R extends perpendicularly to the paper surface of FIG. 1. The pulse laser beams IL are incident on the pattern of the reticle R in the illuminating area 27 at a uniform illumination distribution.

It is preferred that the projection of the area defined between the reticle blinds 8A and 8B be carried out at a projection magnification of 1 or less. The positions of the reticle blinds 8A and 8B are defocussed by a predetermined amount from the conjugate pattern formed face (undersurface) of the reticle R so that the images of the edges of the reticle blinds 8A and 8B provide a predetermined trapezoidal distribution of the amounts of exposure light. The defocussed amount is changed by means of a defocus adjusting mechanism (not shown). The reticle blinds 8A and 8B can be moved toward and away from the optical axis of the illuminating optical system. In other words, the reticle blinds 8A and 8B are movable perpendicularly to the optical axis so as to adjust the narrow width of the slit-shaped elongated area. The light exposure control system 10 controls the operation of driving portions 9A and 9B.

The light beams reflected by the beam splitter 6 are collected on the light receiving surface of a photo-electric detector 26 by means of a condenser lens 25 and converted from light to electric signals. The output signals from the photo-electric detector 26 are supplied to the light exposure control system 10. The output signals from the photo-electric detector 26 have a value proportional to the exposure light energy per laser pulses incident on a wafer W. In the light exposure control system 10, the output signals from the photo-electric detector are accumulated and the accumulated exposure light amount on the wafer W can be calculated.

The reticle R is fixed to a reticle stage 14 by vacuum absorption means or by other mechanical means. The reticle stage 14 is scanned on a reticle guide 15 linearly in a direction X perpendicular to the optical axis AX of the projection optical system PL and parallel to the paper surface of FIG. 1. A movable mirror 16 is fixed to one end of the reticle stage 14. Laser beams from a laser interferometer 17 disposed at the reticle side and externally of reticle stage 14 are reflected by the movable mirror 16. The laser interferometer 17 always monitors the position of the reticle stage 14 in the direction X based on the reflected laser beams. The data of detected coordinates of the reticle stage 14 detected by the laser interferometer 17 is supplied to a stage control system 18. The stage control system 18 controls the scanning speed and the scanning timing of the reticle stage 14. The reticle blinds 8A and 8B form images of edges perpendicular to the scanning direction of the reticle R. In other words, the reticle blinds 8A and 8B have linear edges extending in a direction corresponding to a perpendicular direction to the scanning direction.

The image of the pattern in an illuminating area 27 on the reticle R is projected in the light exposure field (a shot area) on the wafer W. The area on the wafer W which area is conjugate with the slit-shaped illuminating area 27 and the projection optical system PL is a slit-shaped light exposure area 28.

The wafer W is fixed to the wafer holder by vacuum adsorption means or the like. The wafer 19 is mounted on a Z stage 20 for positioning the wafer W in the Z direction parallel to the optical axis of the projection optical system PL. The Z stage 20 is mounted on an XY stage 21 for positioning the wafer W in a two-dimensional plane (the ordinate and the abscissa being taken on the X axis and the Y axis, respectively) perpendicular to the optical axis of the projection optical system PL. The XY stage 21 scans the wafer W in the direction X during the slit scanning light exposure, and the Z stage 20 performs the focussing of the wafer W. A leveling stage (not shown) for adjusting the angle of inclination of the wafer W and a sensor (not shown) for measuring the angle of inclination of the wafer W are provided. An alignment sensor for detecting the positional relationship between the reticle R and the wafer W is also provided but is not shown because this is not an essential element of the present embodiment.

A movable mirror 22 is fixed to one end of the Z stage 20. Laser beams from a laser interferometer 23 disposed at the wafer side and externally of the Z stage 20 are reflected by the movable mirror 22. The laser interferometer 23 always monitors the positions in the directions X and Y of the Z stage 20 (the wafer W) in response to the thus reflected light. The data of the positions of the Z stage detected by the laser interferometer 23 is supplied to the stage control system 18. The stage control system 18 controls the scanning speed and the scanning timing of the stage 21. A main control system 24 for controlling the operation of the whole apparatus controls the light exposure control system 10 and the stage control system 18.

In order to successively project the pattern image of the reticle R on the photosensitive material on the wafer W, the Z stage 20 (i.e., the XY stage 21) is scanned at a constant speed $\beta \cdot V$ in a direction DW along the direction $-X$ in synchronism with the scanning of the reticle stage 14 at the constant speed V in a direction DR (where $\beta$ is the projection magnification of the projection optical system PL and is ¼, for example). When the reticle R is scanned in the direction $-X$, the wafer W is scanned in the direction X. As the reticle R and the wafer W are scanned in the opposite directions at the same constant speeds in complete synchronism with each other and laser beams are generated from the excimer laser beam source 1 at constant time intervals, the pattern images of the reticle R are successively projected on the photosensitive material on the wafers W.

Measured data from the laser interferometers 17 and 23 is used for facilitating the synchronized scanning of the reticle stage 14 and the Z stage 20 at the side of the wafer at the constant speeds. The driving mechanism of these stages comprises a linear motor and an air guide combined therewith, for example, which facilitates scanning at constant speeds. The positions and the speeds of the reticle stage 14 and the XY stage 21 at the side of the wafer are controlled by control signals produced by the main control system 24 and passing through the stage control system 18. The light exposure control system 10 accumulates detected signals from the photo-electric detector 26, and sets the edges of the reticle blinds 8A and 8B at the positions obtained by the calculation, and supplies to the laser source 1 the triggers of the pulse outputs and the average value of pulse energies under instructions of the main control system 24 (as will be detailed later).

A description will be given by assuming that the reticle R is scanned in the direction DR (the direction X) with respect to the illuminating area 27 and the wafer W is scanned in the direction DW (the direction $-X$) in a slit scanning exposure. In this embodiment, the position of the lower reticle blind 8B is moved within a predetermined range in a direction a perpendicular to the optical axis so that the edge at the rear side of the scanning direction is moved in a direction b along the direction X. The edge at the rear side in the scanning direction (the direction DW) is moved by $\Delta X$ in the direction X. By moving the edge at the rear side in the scanning direction of the light exposure area 28, a small number of pulses allows the accumulated amount of exposure light to be set to the aimed amount of exposure light. Further, in this embodiment, the period of pulse generation is set so as to produce pulse light from the excimer laser beam source 1 every time the wafer W is moved by a distance d in the direction X.

Figure 2A:
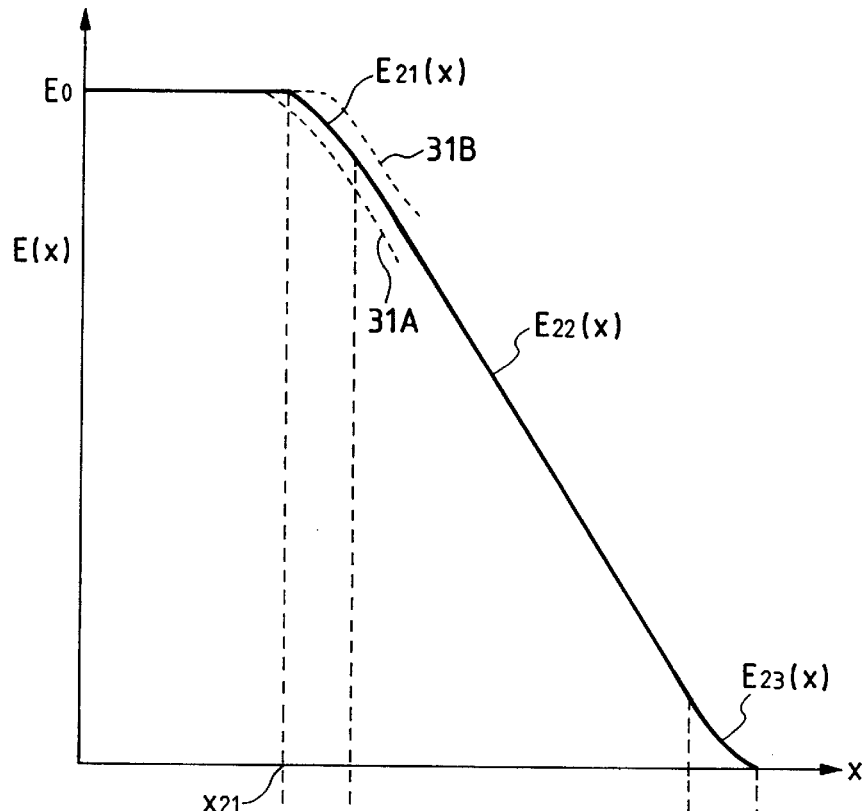
FIG. 2A is a graph showing an ideal accumulated exposure light amount distribution on a wafer.
Figure 2B:
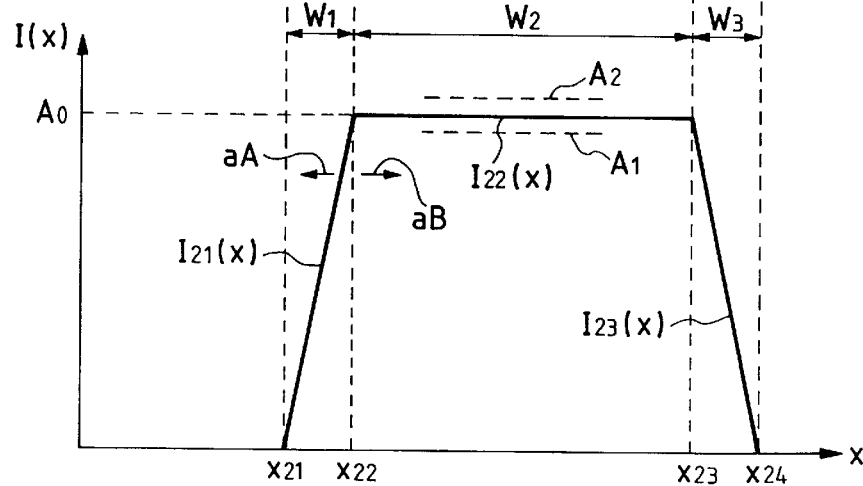
FIG. 2B shows a graph showing an exposure light amount distribution per pulse on a wafer.

FIG. 2A shows a distribution of the accumulated amount of exposure light E(X) at a position X when the wafer scanning direction is the direction X, and FIG. 2B shows a distribution of the amount of exposure light I(X) of the slit-shaped light exposure area at a position X in the scanning direction on the wafer when the distribution of the accumulated amount of exposure light E(X) is shown in FIG. 2A. In FIGS. 2A and 2B it is assumed that the wafer is stationary and the slit-shaped light exposure area 28 as shown in FIG. 1 is moved on the wafer W in the positive direction X, for convenience. In FIG. 2B, the distribution of the amount of exposure light I(X) forms a trapezoidal shape in the scanning direction in which the portion in the region $X_{21} \leq X_{22}$ is a rising line, the portion in the region $X_{22} \leq X_{23}$ takes a constant value $A_0$, and the portion in the region $X_{23} \leq X_{24}$ is a descending line. In other words, between both sides of the trapezoid having widths $W_1$ and $W_3$ measured along the direction X is disposed a flat portion having a width $W_2$ measured along the direction X. The slit-shaped light exposure area is scanned from the position of the smallest value on the X axis toward the position of the largest value on the X axis in the positive direction. When the distribution of the amount of exposure light I(X) is as shown in FIG. 2B, the distribution of the accumulated amount of exposure light E(X) is as shown in FIG. 2A.

In the rising range of the distribution of the amount of exposure light E(X), i.e., in the range $X_{21} \leq X_{22}$, the portion of the distribution of the accumulated amount of exposure light E(X) looks as if it were a continuous curve $E_{21}(X)$. However, it is not so when it is checked in detail.

In FIG. 2A, the light exposure ends at the portion $X < X_{21}$, and the accumulated amount of exposure light becomes a constant value $E_0$ in an ideal case. The accumulated amounts of exposure light $X_{21} \leq X_{22}$, $X_{22} \leq X_{23}$ and $X_{23} \leq X_{24}$ are expressed by $E_{21}(X)$, $E_{22}(X)$ and $E_{23}(X)$, respectively. When the light exposure is performed at a constant scanning speed and the exposure light energy (pulse energy) per generated pulse can be set to a constant value every predetermined time interval, ideal accumulated amounts of exposure light expressed by distribution functions such as $E_{21}(X)$, $E_{22}(X)$ and $E_{23}(X)$ can be obtained and the accumulated amount of exposure light in the area in which the light exposure is terminated is the aimed exposure light $E_0$. When, however, an excimer laser source is used as an actual light source, pulse energies are varied from pulse to pulse, and the predetermined accumulated amount of exposure light cannot be obtained from a small number of accumulated pulses.

More concretely, even if a generated pulse shows distributions of the amounts of exposure light $I_{21}(X)$, $I_{22}(X)$ and $I_{23}(X)$ and the flat portion shows an ideal value $A_0$, the next pulse shows a different value from the amount of exposure light $A_0$. At the variation of pulse energies of $\pm 7\%$, the control accuracy of the amount of exposure light cannot be made $\pm 1\%$ or less, if the number of accumulated pulses is not 50 or more. Even if the exposure light energy density per pulse at the exposure surface of the wafer is increased by enhancing the resist sensitivity and improving light transmitting efficiency, the scanning speeds of the reticle and the wafer during the light exposure cannot be increased, because of the lower limit of the number of pulses.

At a constant scanning speed, the number of pulses cannot be reduced to a value smaller than its lower limit in order to reduce the maintenance cost for the excimer laser light source.

Figure 3:
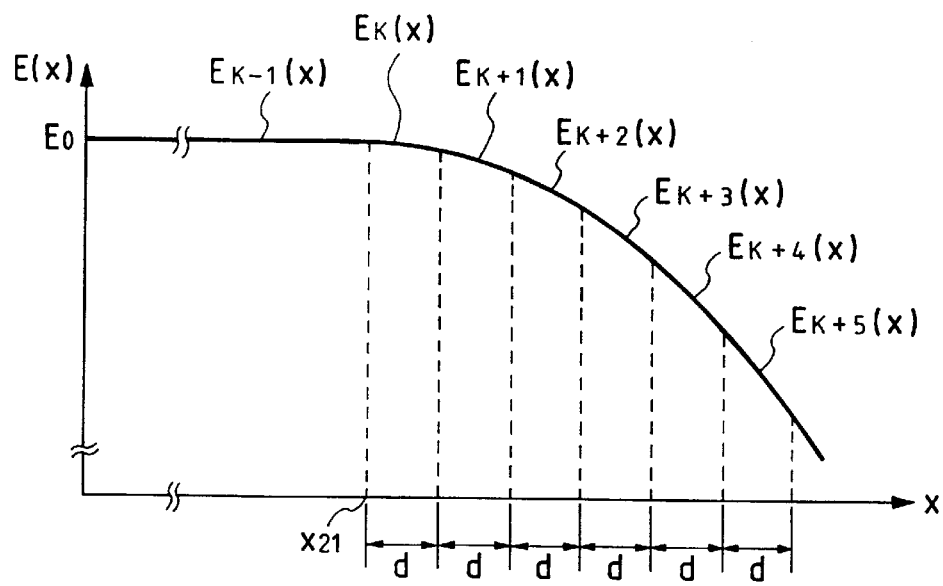
FIG. 3 is a graph showing the accumulated exposure light amount distribution at the position $x_{21}$ in an enlarged scale.

FIG. 3 shows the detail of the distribution of the accumulated amount of exposure light E(X) at and in the vicinity of the position $X_{21}$ in FIG. 2A. Since pulse light exposure is carried out every time the XY stage 21 at the side of the wafer is moved by a distance d in the direction –X, i.e., the light exposure area 28 is moved by the distance d in the X direction, the curve of the distribution of the accumulated amount of exposure light E(X) is bent at every distance d. More concretely, the distribution of the accumulated amount of exposure light E(X) changes at every distance d as shown by $E_k(X)$, $E_{k+1}(X)$, $E_{k+2}(X)$, - - - .

Figure 4:
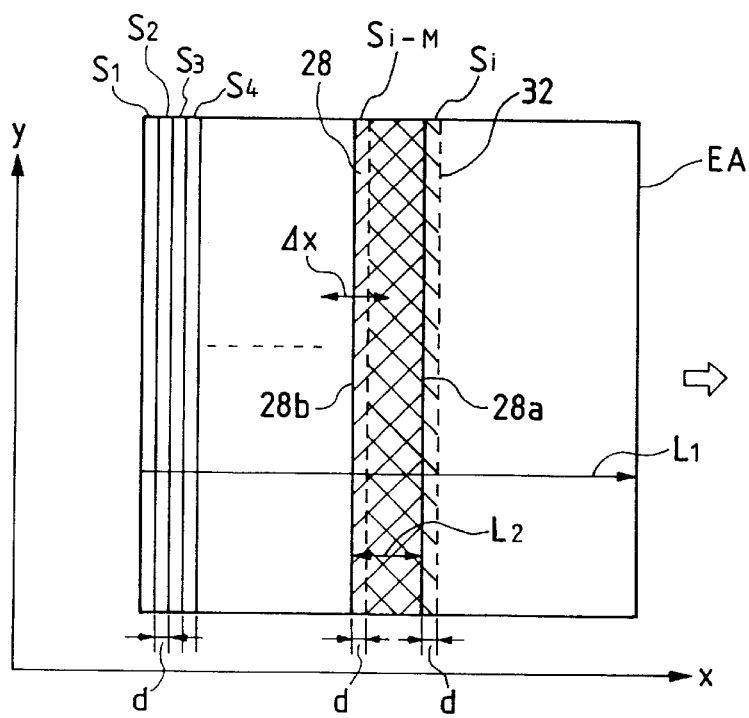
FIG. 4 is a plan view of accumulated exposure light amount calculating zones per pulse light generation on the light exposure field on a wafer and a slit-shaped light exposure area per pulse light.

FIG. 4 shows movements of the light exposure area 28 on the wafer W, in which at least one LSI is normally included in a light exposure field EA. In the coordinate system in which the wafer W is stationary, the light exposure area 28 advances in the positive direction of the X axis. In this connection, the first exposed calculating zone of the light exposure area 28 in the light exposure field EA is indicated by $S_1$. As pulse light is generated every time the light exposure area is moved by the distance d in the direction X, the calculating zones $S_1$, $S_2$, $S_3$, $S_4$, - - - formed by dividing the light exposure area 28 at intervals of substantial distance of d are exposed by light in turn.

Let it be assumed that the width of the slit-shaped light exposure area 28 measured in the scanning direction is M times of the distance d (M being an integer such as 20 or so, for example). Then, the light exposure area 28 covers approximately M accumulated exposure light amount calculating zones $S_{i-M}$ to $S_{i-1}$ at the time of generation of pulse light, and covers the exposure light zone 32 consisting of almost all accumulated exposure light calculating zones $S_{i-M+1}$ to $S_i$ at the time of generation of the next pulse light.

After the light exposure, the distribution of the accumulated amount of exposure light in the light exposure field EA is made as even as possible. In doing so, a wider area defined by the reticle blinds 8A and 8B than the light exposure field EA in the scanning direction may be illuminated and the portions other than the circuit pattern on the reticle to be transcribed may be shielded by a shielding plate (not shown) movable in synchronism with the reticle R. In other words, the light exposure portion defined by the light exposure area 28 may be controlled by other reticle blinds than the reticle blinds 8A and 8B. As the latter reticle blinds, there may be used a proximity blind provided closely to the upper or lower surface of the reticle R or a projection type blind employing a lens system. The projection type blinds are disposed closely to the reticle blinds 8A and 8B and set precisely in a plane conjugate with the pattern forming surface of the reticle R. The reticle blinds 8A and 8B are provided at such positions that they are displaced slightly from the conjugate surface and the projection image is blurred in the pattern forming face of the reticle R. In this embodiment, the reticle blind 8A corresponding to the edge 28a of the light exposure area 28 disposed at the light exposure starting side (the front side of the scanning direction) does not move, but the reticle blind 8B corresponding to the edge 28b of the light exposure area 28 disposed at the light exposure ending side (the rear side of the scanning direction) changes its position every time pulse light is generated, thereby making uniform the accumulated amount of exposure light in the scanning direction on the wafer W.

Figure 7:
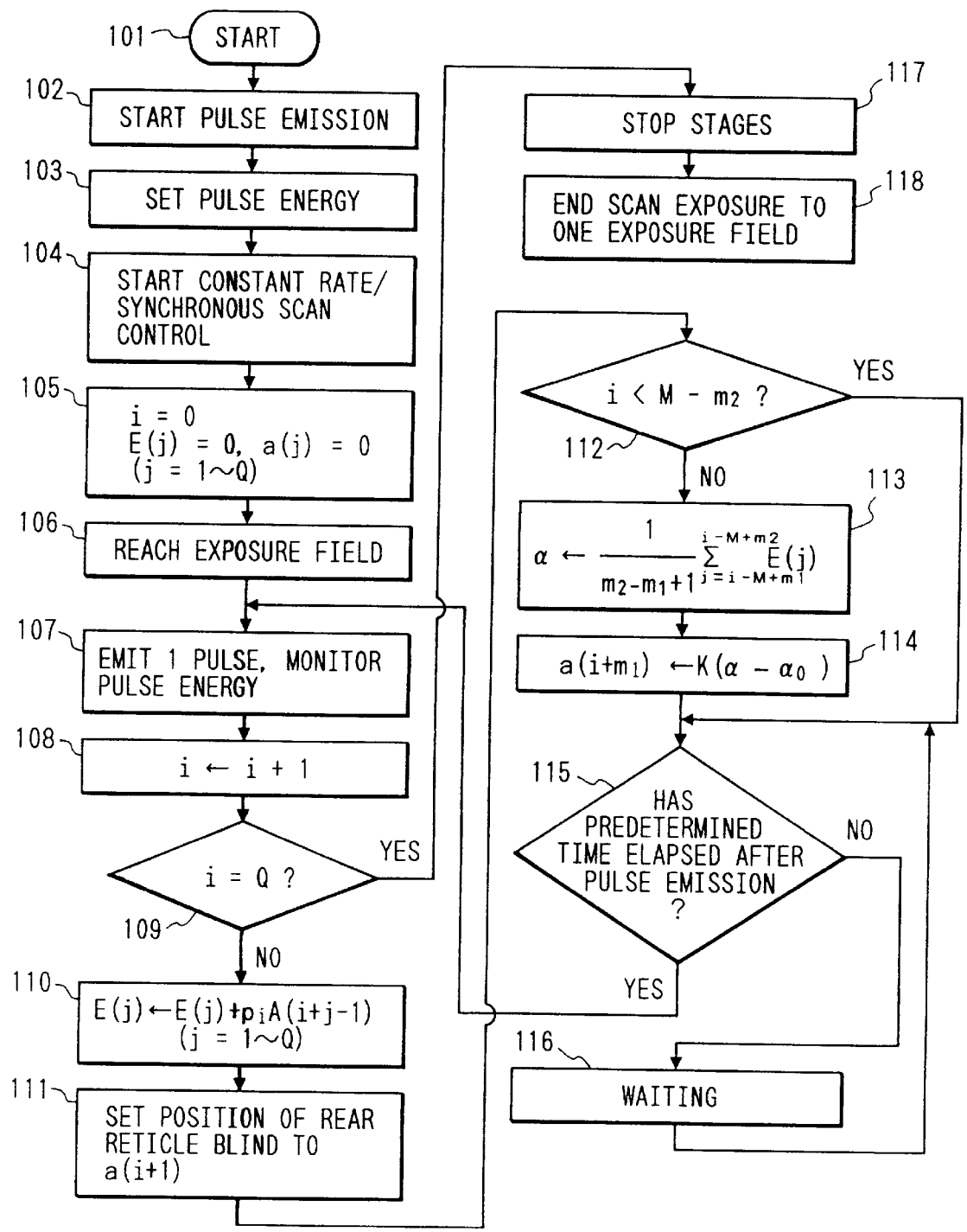
FIG. 7 is a flow chart showing operation of an example of the slit scanning type light exposure apparatus of FIG. 1 in a slit scanning exposure.

The operation of this embodiment will be described with reference to a flow chart as shown in FIG. 7. The pattern image of a reticle R is exposed in a light exposure field EA on the wafer W in a slit scanning light exposure as follows. First, in step 101 in FIG. 7, the reticle stage 14 and the XY stage 21 at the wafer side are placed at the positions separated by a distance corresponding to the amount of approach run for scanning from the positions corresponding to the predetermined light exposure area, then the approach run is initiated. Thereafter, pulse light is started to be generated from the excimer laser beam source 1 in stop 102. The pulse energies are stabilized and the average value of the pulse energies produced every time pulse light is generated is set in step 103 to the aimed average pulse energy.

In this case, the outputs of pulse energies from the excimer laser beam source 1 may be set to a constant value, or the average of the pulse energies may be set to the predetermined value. The set value of the pulse energy can be obtained from $E_0/M_0$, where $M_0$ is the number of the aimed pulses when a point on the wafer W is exposed and $E_0$ is a value converted from the aimed accumulated exposure light energy density on the photosensitive material on the wafer W into the accumulated amount of exposure light of the laser pulse energy.

In step 104, the XY stage 21 at the wafer side and the reticle stage 14 are scanned at a stable speed in synchronism with each other in a predetermined relationship. The light exposure control system 10 is provided with memories having addresses corresponding to the accumulated exposure light calculating zones $S_1$ to $S_q$ formed by dividing the light exposure field EA at the intervals of d at which the light exposure area 28 is relatively moved every time pulse light is generated.

The memories store the accumulated amounts of exposure light E(j) at every j-th calculating zone of the accumulated amount of exposure lights $S_j$ (j being 1 to Q). The accumulated amount of exposure light E(j) is not precisely constant throughout the corresponding zone but the value of its central portion or of one end thereof or the average value is used as a representative value. Each memory has enough capacity which can memorize the aimed position a(j) when the light exposure in the j-th accumulated exposure light calculating zone $S_j$ is terminated. The number Q of the accumulated exposure light calculating zones is expressed by the following equation:

$$Q=[L_1/d]+1 \qquad (1)$$

where $L_1$ is the length $L_1$ of the light exposure field EA of FIG. 4 in the scanning direction, d is a scanning distance per pulse and $[L_1/d]$ shows the maximum integer which does not exceed the value $L_1/d$.

Let it be considered that the data of the accumulated exposure light calculating zones is erased. Since the actually necessary accumulated exposure light calculating zones are contained in the light exposure area 28, the number Q of the accumulated exposure light calculating zones may be expressed by:

$$Q=[L_2/d]+1 \qquad (2)$$

where $L_2$ is the width of the light exposure area 28 of FIG. 4 in the scanning direction.

In this embodiment, however, Q is obtained from Equation (1).

The aimed position a(j) is a deviation from the standard value and the initial value is set to the standard value. Thus, in step 105 the variable i in the pulse counter is reset, i.e., i is made zero, all aimed positions a(j) are made zero. At the same time, the numbers 1 to Q are made equal to j and thus the initial values of all accumulated amounts of exposure light are also made zero. In step 106, the light exposure area 28 enters the light exposure field EA on the wafer W.

In step 107, a pulse of light is generated when the wafer W is moved by a distance d in the direction X from the position just prior to this position. A photo-electric conversion signal is supplied from the photo-electric detector 26 in FIG. 1 to light exposure control system 10. A pulse energy $p_i$ is calculated in the light exposure control system 10. In the next step 108, the value of the variable i is added to by 1.

Figure 6:
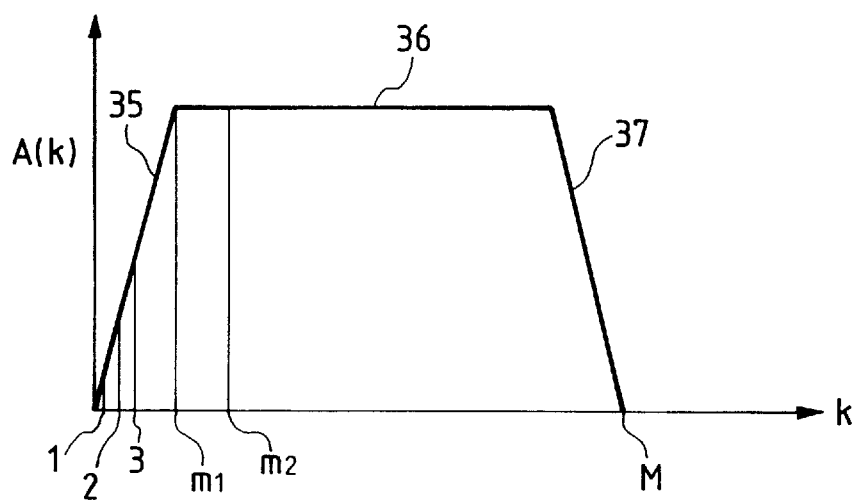
FIG. 6 is a graph showing the constants memorized in a light exposure control system in correspondence to exposure light distributions per pulse.

In step 109, a check is made whether the variable i is the limited value Q. If the variable i is not the upper limit Q, the process goes to step 110. In step 110, the accumulated amounts of exposure light E(j) of the first to i-th accumulated exposure light amount calculating zones $S_1$ to $S_i$ are calculated. A set of constants A(k) corresponding to the divided zones of the distribution of the amounts of exposure light of the light exposure area 28 in the scanning direction are used here. The set of constants A(k) (k=1, 2, 3, - - -, M) express the values of the sections divided at intervals d from the trapezoidal distribution per pulse. As shown in FIG. 6, the curves 35 to 37 define a trapezoidal shape, and the number of its divided widths is M which corresponds to the width of the light exposure area 28 per generation of pulse exposure light in the scanning direction. The set of constants A(k) can be set by previously measuring the illuminance distribution in the light exposure area 28 or can be obtained by outputs from an intensity distribution monitor provided in the same plane as the wafer W or in another plane conjugate therewith. The actual distribution of the amounts of exposure light is proportional to the pulse energies $p_i$ and is expressed by $p_i \cdot A(i+j-1)$. The new accumulated amount of exposure light E(j) is this value plus the just previous accumulated amount of exposure light E(j). A(i+j-1) is the trapezoidal intensity distribution corresponding to the i-th block of the light exposure area 28, where i is 1 to Q.

In the next step 111, a command for setting the reticle blind 8B at the rear side in the scanning direction to the position a(i+1) is supplied from the light control system 10 to the driving portion 9B, and the movement of the reticle blind 8B stops by the time of generating the next pulse light. Since the reticle blind 8B must be moved during the time interval between the generation of a pulse light and the generation of the next pulse light, the reticle blind 8B is driven at a high speed by using a driving unit such as a piezo element or a motor and a position sensor such as a linear encoder.

Figure 5:
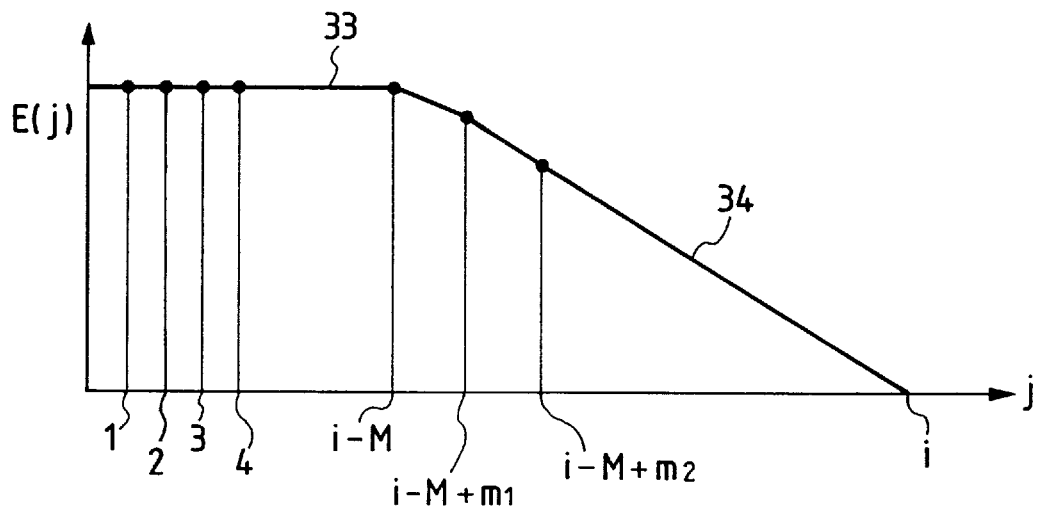
FIG. 5 is a graph of the accumulated amount of exposure light in an accumulated exposure light calculating zone.

In step 112, a check is made as to whether the variable i is smaller than $(M-m_2)$. The numbers M and $m_2$ will be explained. In FIG. 5 is shown the accumulated amounts of exposure light E(j). When light exposure is carried out on the i-th accumulated exposure light amount calculating zone on the wafer W, light exposure has been completed on the accumulated light exposure zone which is M zones prior to the presently exposed calculating zone (i.e., (i−M)th calculating zone) and the calculating zones preceding it. The calculating zone on which exposure is initiated and the calculating zones on which exposure has not yet been carried out are the (i−M)th to i-th calculating zones and the amounts of the accumulated amounts of exposure light E(j) are indicated in a bent line 34 descending toward the right side.

The position a(i+1) of the reticle blind 8B is determined depending upon conditions as to how much the accumulated amounts of exposure light $E(i-M+m_1)$, $E(i-M+m_1+1)$, - - - , $E(i-M+m_2)$ of the $m_1$-th to $m_2$-th accumulated exposure light amount calculating zones counted toward the right side from the calculating zone on which exposure light has been exposed just now are deviated from the aimed accumulated amount of exposure light $\alpha_0$.

Returning to FIG. 7, when $i<(M-m_2)$ in step 112, the number of the accumulated pulses is not sufficient. It shows that the position a(i+1) of the reticle blind 8B cannot be changed from the initial value. The process goes to step 115. When, on the other hand, it is determined that $(M-m_2) \leq i$, it means that pulses overlap so that the position of the reticle blind 8B can be changed from the initial value to the position a(i+1) in accordance with the accumulated amounts of exposure light. In this condition, the process goes to step 113.

In step 113, an average α of the accumulated amounts of exposure light of the accumulated exposure light amount calculating zones is obtained from the accumulated amounts of the $(i-M+m_1)$th to $(i-M+m_2)$th calculating zones, and the aimed position $a(i+m_1)$ is calculated from the value of the difference between α and $\alpha_0$ multiplied by a proportional constant K. In other words, the following equation holds true:

$$a(1+m_1)=K(\alpha-\alpha_0) \qquad (3)$$

The constant K is determined by calculation or by experience so that light exposure blur becomes the minimum. When the amount of exposure light of the flat portion is lowered to the level $A_1$ as shown in FIG. 2B and the accumulated amounts of the just previous light exposure is reduced to the curve 31A smaller than the designed value as shown in FIG. 2A, the reticle blind 8B is moved so that the edge at the rear side in the scanning direction of the distribution of the amount of exposure light per generation of the just previous exposure light is opened in the direction aA by the time of generation of the next exposure light and the light exposure is performed. In contrast, when the amount of the just previous light exposure of the flat portion increases to the level $A_2$ and the accumulated amount of exposure light is larger than the designed value as shown by the curve 31B in FIG. 2A, the reticle blind 8B is moved so that the edge at the rear side in the scanning direction of the distribution of the amount of exposure light per generation of the just previous exposure light is closed in the direction aB by the time of generation of the next exposure light and the light exposure is carried out. In this way, the accumulated amounts of exposure light are equalized even if pulse energies vary.

In step 115, a check is made as to whether the time between adjacent generation of pulse light has elapsed. If the time has elapsed, the process returns to step 107. If not, the process returns to step 115 after waiting in step 116.

When it is determined that i=Q in step 109, the process goes to step 117. In step 117, a command for stopping the Z stage 20 at the wafer side and the reticle stage 14 is supplied from the light exposure control system 10 to the stage control system 18 through the main control system 24. In the succeeding step 118, the scanning of the exposure light corresponding to one light exposure field on the wafer W ends. The data of the accumulated amounts of exposure light is supplied from the light exposure control system 10 to the main control system 24 and is stored. Differences between the actual accumulated amounts of exposure light and the aimed accumulated amount of exposure light are calculated.

When the control accuracy exceeds the required value or the uniformity becomes poorer than required, a warning signal or an error signal is sent to a display unit. After the light exposure corresponding to one light exposure field is completed, the next process for light exposure on the next light exposure field starts.

In this embodiment, a description has been given in that scanning of slit scanning light exposure is performed in one direction. However, scanning in the other direction may also be carried out. In the latter case, the reticle blind 8B is fixed at the standard position and the position of the reticle blind 8A is controlled. In this embodiment, portions other than the pattern are covered with reticle blinds other than the reticle blinds 8A and 8B at the boundaries of the end portions of the light exposure field EA in FIG. 4. When the reticle blinds 8A and 8B are moved in opposite directions to the scanning directions at the same speed as the scanning speed in synchronism with the scanning of the reticles at the boundaries of light exposure field EA, the image of the reticle blind 8A or the reticle blind 8B is stationary on the wafer W. The light exposure area may be limited by this mechanism.

In this embodiment, only the reticle blinds 8A and 8B for forming the images of the edges perpendicular to the scanning direction are described as reticle blinds, but it is preferred that reticle blinds for forming the images of the edges parallel with the scanning direction be provided. However, it is unnecessary that the latter reticle blinds be moved every time pulse light is generated. It is better that the positions of the latter reticle blinds can be adjusted only when the widths of the light exposure field perpendicular to the scanning direction and the positions of the light exposure field are changed. Accordingly, it is desirable that the reticle blinds for forming the images of the edges parallel with the scanning direction be provided at a position conjugate with the pattern forming face of the reticle R in the vicinity of the reticle blinds 8A and 8B as shown in FIG. 1. The light shield band around the light exposure area of the reticle R is narrowed by using such reticle blinds. Thus, the light shield band of the reticle R is easily manufactured.

In this embodiment, the reticle blinds 8A and 8B of a projection type are used. However, reticle blinds of a proximity type comprising movable shield plates displaced closely to the upper or lower surface of the reticle R, for example, may be used instead of the reticle blinds of a projection type.

The present invention is most effective when it is applied to a light exposure apparatus of a slit scanning type using a pulse light source which emits pulse light whose energy is varied. However, the present invention can be applied to a projection light exposure apparatus of a slit scanning type using a continuous light emitting light source such as a hydrogen lamp when the light source generates light whose intensity varies greatly. In this case, no constant pulse interval is used as a parameter of light exposure, but the accumulated exposure light amount calculating zones for corresponding pulses of FIG. 4 $S_1$, $S_2$, - - - can be replaced by light exposure intervals divided at the scanning width per a constant time.

In this embodiment using a pulse light source, the exposure apparatus has memories for the accumulated amounts of exposure light corresponding to the accumulated exposure light calculating zones in each light exposure area which advance every time when pulse light is produced. However, each of the accumulated amounts of exposure light may be made to correspond to a zone in response to a plurality of successive pulses.

The present invention is not limited to the abovementioned embodiments but is applicable to modifications within the scope of the present invention.

With the projection light exposure apparatus of a slit scanning light exposure type according to the present invention, the control accuracies of the accumulated amounts of exposure light can be enhanced by a small number of pulses, because the position in the scanning direction of a variable field stop for limiting the light exposure area is controlled due to the accumulated amounts of exposure light during light exposure.

When changed with respect to the scanning direction of the mask in the illuminating area having a predetermined shape through the variable field stop, the position of the rear edge can be easily controlled.

What is claimed is:

1. A scanning exposure method comprising the steps of:
   illuminating a mask with pulse light from a stop to define an area of pulse light incident on the mask;
   moving a substrate in synchronism with movement of the mask to expose the substrate with the illuminated mask;
   calculating individual accumulated amounts of pulse light per each of divided areas obtained by dividing an exposure area on the substrate into a plurality of areas with respect to a direction of the movement of the substrate; and
   adjusting, with respect to said direction of movement, a position of at least one of two edges of said stop based on said calculated amounts of pulse light.

2. A scanning exposure method comprising the steps of:
   moving a mask relative to pulse light to illuminate the mask;
   moving a substrate synchronously with the movement of the mask to expose an area on the substrate with the illuminated mask;
   detecting an accumulated amount of pulse light radiated on at least one of a plurality of portions in said area on the substrate during the synchronous movement; and
   adjusting a dimension of the pulse light on the substrate in a direction of the movement of the substrate, based on the detected amount of pulse light.

3. A method according to claim 2, wherein at least one edge of a field stop through which the pulse light passes is moved to adjust said dimension.

4. A method according to claim 3, wherein said at least one edge of said field stop is moved based on a difference between said detected amount of pulse light and a corresponding predetermined accumulated amount of pulse light.

5. A scanning exposure method comprising the steps of:
   moving a mask relative to pulse light to illuminate the mask;
   moving a substrate synchronously with the movement of the mask to expose the substrate with the illuminated mask;
   detecting an intensity of the pulse light during the exposure of the substrate; and
   adjusting a dimension of the pulse light on the substrate in a direction of the movement of the substrate, based on the detected intensity.

6. A method according to claim 5, further comprising the step of:
   adjusting an intensity of the pulse light during a period prior to the exposure of the substrate and after a start of the synchronous movement.

7. A method according to claim 5, wherein an intensity distribution of the pulse light on the substrate in said direction of movement of the substrate has a slope portion.

8. A method according to claim 7, wherein said intensity distribution is substantially trapezoidal.

9. A scanning exposure method comprising the steps of:

moving a mask relative to pulse light to illuminate the mask;

moving a substrate synchronously with the movement of the mask to expose the substrate with the illuminated mask;

detecting a parameter of the pulse light during a period prior to the exposure of the substrate and after a start of the synchronous movement; and adjusting an optical property of the pulse light radiated on the substrate based on the detected parameter.

10. A method according to claim 9, wherein an intensity of the pulse light is changed to adjust said optical property.

11. A method according to claim 9, further comprising the step of:

adjusting a dimension of the pulse light on the substrate, in a direction of the movement of the substrate, during the exposure of the substrate.

12. A method according to claim 11, wherein a width of a slit-like aperture through which the pulse light passes is changed to adjust said dimension.

13. A method according to claim 9, wherein an intensity distribution of the pulse light on the substrate in a direction of the movement of the substrate has a slope portion.

14. A method according to claim 13, wherein said intensity distribution is substantially trapezoidal.

15. A scanning exposure apparatus comprising:

an illumination system that illuminates a mask with pulse light;

a stage system that synchronously moves the mask and a substrate to expose an area on the substrate with the illuminated mask;

a measuring system that determines an accumulated amount of pulse light radiated on at least one of a plurality of portions in said area on the substrate during the synchronous movement; and an adjusting system that adjusts a dimension of the pulse light on the substrate in a direction of the movement of the substrate, based on the determined amount of pulse light.

16. A scanning exposure apparatus comprising:

an illumination system having an optical system disposed between a light source and a mask to illuminate the mask with pulse light from the light source; and a stage system that synchronously moves the mask and a substrate to expose the substrate with the illuminated mask, wherein said optical system includes a field stop disposed, in a direction along an optical axis of said illumination system, apart from a plane conjugate to the mask with respect to said optical system, so that an intensity distribution of the pulse light on the mask in a direction of the movement of the mask has a slope portion.

17. An apparatus according to claim 16, wherein said intensity distribution is substantially trapezoidal.

18. An apparatus according to claim 16, further comprising:

an adjusting system having a detector that receives pulse light from said light source to adjust a dimension of the pulse light on the substrate in said direction of movement based on an output of the detector during the exposure of the substrate.

19. An apparatus according to claim 16, further comprising:

an adjusting system that adjusts an intensity of the pulse light during a period prior to the exposure of the substrate and after a start of the synchronous movement.

20. A scanning exposure apparatus comprising:

an illumination system that illuminates a mask with pulse light;

a stage system that synchronously moves the mask and a substrate to expose the substrate with the illuminated mask;

a detector that detects a parameter of the pulse light during a period prior to the exposure of the substrate and after a start of the movement; and an adjusting system that adjusts an optical property of the pulse light radiated on the substrate, based on an output of the detector.

21. An apparatus according to claim 20, wherein said adjusting system includes an optical device to change an intensity of the pulse light.

22. An apparatus according to claim 20, wherein said adjusting system includes a controller to control a light source that emits the pulse light.

23. A scanning exposure apparatus comprising:

an illumination system that illuminates a mask with pulse light;

a stage system that synchronously moves the mask and a substrate to expose the substrate with the mask on which pulse light is radiated; and a detector that detects a parameter of the pulse light during a period prior to the exposure of the substrate and after a start of the synchronous movement to determine an optical property of the pulse light radiated on the substrate.

24. A scanning exposure method comprising the steps of:

synchronously moving a mask illuminated with pulse light and a substrate to expose the substrate through the illuminated mask; and detecting an optical characteristic of the pulse light during a period prior to the exposure of the substrate and after a start of the synchronous movement.

25. A scanning exposure apparatus comprising:

a light source that emits pulse light;

a stage system that synchronously moves a mask and a substrate to expose the substrate with the mask on which the pulse light is radiated; and a detector that receives pulse light emitted from the light source prior to the exposure of the substrate and after a start of the synchronous movement.

* * * * *